US006416410B1

(12) United States Patent
Abou-Samra et al.

(10) Patent No.: US 6,416,410 B1
(45) Date of Patent: Jul. 9, 2002

(54) DATA COMPRESSION/DECOMPRESSION BASED ON PATTERN AND SYMBOL RUN LENGTH ENCODING FOR USE IN A PORTABLE HANDHELD VIDEO GAME SYSTEM

(75) Inventors: Samir Abou-Samra; Claude Comair, both of Vancouver (CA); Robert Champagne, Redmond, WA (US); Sun Tjen Fam; Prasanna Ghali, both of Vancouver (CA); Stephen Lee, Redmond, WA (US); Jun Pan, Bellevue, WA (US); Xin Li, Issaquah, WA (US)

(73) Assignee: Nintendo Co., Ltd., Kyoto (JP)

( * ) Notice: Subject to any disclaimer, the term of this patent is extended or adjusted under 35 U.S.C. 154(b) by 0 days.

(21) Appl. No.: 09/453,721

(22) Filed: Dec. 3, 1999

(51) Int. Cl.⁷ .............................. A63F 13/00; A63F 9/24; G06F 17/00; G06F 19/00
(52) U.S. Cl. .............................. 463/31; 463/32; 463/34; 463/43; 345/614; 345/629; 345/631; 345/684; 345/688; 382/232; 382/233; 704/503; 704/504
(58) Field of Search .............................. 463/31, 1, 4, 7, 463/32, 33, 34, 36, 37, 43, 44, 45; 345/619, 688, 629, 631, 634, 638, 672, 784, 788, 530, 531, 684; 382/232, 233; 704/503, 504

(56) References Cited

U.S. PATENT DOCUMENTS 4,398,189 A   8/1983   Pasierb, Jr. et al.
4,580,134 A * 4/1986   Campbell et al. ............ 345/589
5,353,061 A * 10/1994  Rodriguez et al. ...... 375/240.12
5,371,512 A * 12/1994  Otake et al. ................. 345/551
5,418,568 A * 5/1995   Keith ...................... 375/240.25
5,434,568 A * 7/1995   Moll ........................... 341/63
5,483,257 A   1/1996   Otake et al.
5,600,316 A   2/1997   Moll
5,996,033 A   11/1999  Chiu-Hao
6,139,433 A * 10/2000  Miyamoto et al. ........... 345/474
6,198,477 B1 * 3/2001   Kurtze et al. ............ 707/500.1
6,215,523 B1 * 4/2002   Anderson ............... 348/333.05

FOREIGN PATENT DOCUMENTS

EP   0 581 713 A2   2/1994
EP   0 783 208 A2   7/1997

OTHER PUBLICATIONS

Murray et al., *Graphics File Formats* (O'Reilly & Associates 2d Ed. 1996), Chapter 9, "Data Compression" at pp. 153–218.

* cited by examiner

Primary Examiner—Valencia Martin-Wallace
Assistant Examiner—Binh-An Nguyen
(74) Attorney, Agent, or Firm—Nixon & Vanderhye, P.C.

(57) ABSTRACT

Loss-less data compression/decompression especially useful in a limited resource environment such as a handheld portable video game system allows graphics and/or attribute data to be efficiently and quickly decompressed on an as-needed basis in real time response to interactive user inputs. A two-level run-length-encoding is used to encode redundant patterns and redundant symbols. A common sentinel field format encodes whether data following the field is non-redundant data, a symbol run, or a pattern run. Compression ratios of 60% for representative symbol-mapped video display graphics/attribute files can be achieved.

3 Claims, 10 Drawing Sheets

EXAMPLE DECOMPRESSION PROCESS FLOWCHART

EXAMPLE VIDEO GAME PROGRAM

DISPLAY RAM 52 MEMORY MAP

| BANK 0 | BANK 1 | BLOCK NO. |
|---|---|---|
| CHARACTER DATA (Tiles) | CHARACTER DATA (Tiles) | |
| BG DISPLAY DATA 1 | | |
| CHARACTER CODE | ATTRIBUTE DATA | 0 |
| CHARACTER CODE | ATTRIBUTE DATA | 1 |
| . | . | . |
| . | . | . |
| . | . | . |
| CHARACTER CODE | ATTRIBUTE DATA | 1022 |
| CHARACTER CODE | ATTRIBUTE DATA | 1023 |
| BG DISPLAY DATA 2 | | BLOCK NO. |
| CHARACTER CODE | ATTRIBUTE DATA | 0 |
| CHARACTER CODE | ATTRIBUTE DATA | 1 |
| . | . | . |
| . | . | . |
| . | . | . |
| CHARACTER CODE | ATTRIBUTE DATA | 1022 |
| CHARACTER CODE | ATTRIBUTE DATA | 1023 |

*FIG. 2A (PRIOR ART)*

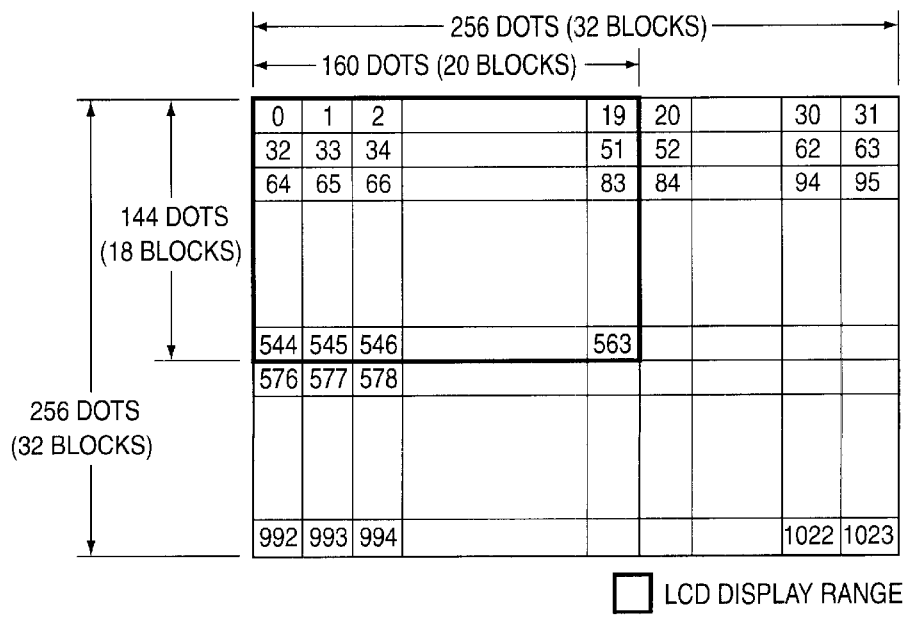

*FIG. 2B (PRIOR ART)*

EXAMPLE SENTINEL FIELD JOURNAL

EXAMPLE PATTERN FIELD JOURNAL

EXAMPLE COMPRESSION PROCESS FLOWCHART

EXAMPLE DECOMPRESSION PROCESS FLOWCHART

EXAMPLE DECOMPRESSION PROCESS

EXAMPLE VIDEO GAME PROGRAM

US 6,416,410 B1

DATA COMPRESSION/DECOMPRESSION BASED ON PATTERN AND SYMBOL RUN LENGTH ENCODING FOR USE IN A PORTABLE HANDHELD VIDEO GAME SYSTEM

FIELD OF THE INVENTION

This invention relates to data compression/decompression and more particularly, to image data compression and decompression. Still more particularly, the present invention relates to run length encoding of patterns and symbols (e.g., characters) to provide efficient and rapid loss-less decompression of character-mapped graphics data within a limited resource environment such as a handheld portable video game system.

BACKGROUND AND SUMMARY OF THE INVENTION

The world of video games has been transformed by the increased amount of computing power that can be placed on a single semiconductor integrated circuit chip. Games that just a few years ago were available only on expensive arcade video systems can now be played on inexpensive handheld portable video game systems.

The GAME BOYS® and GAME BOY COLOR® portable video game systems sold by Nintendo have become quite popular in recent years. These handheld systems offer impressive interactive video game play in a very compact and inexpensive (less than $100) package. One of the challenges facing game developers for these systems is how to develop increasingly sophisticated and complex games that are fun and interesting and yet operate within the very limited memory and processing resources these systems offer.

As one example, suppose one wants to implement an adventure game on GAME BOY COLOR®. The display memory of GAME BOY COLOR® stores a background character map that is several (e.g., four to eight) times larger than the screen the liquid crystal display can display at one time. This allows for smooth scrolling of a display "window" within a larger virtual display area (for example, a landscape or "level" within the adventure game). But suppose one desires to make a very interesting adventure game allowing smooth scrolling within an expansive landscape comprising many hundreds of image screens. The limited display memory of GAME BOY COLOR® cannot store so many screens worth of image information at one time, and storing this many screens of image information in a game cartridge will require a large amount of read only memory space. One way to solve this problem is to use data compression to transform the image data so it occupies less space.

Because images can take up a lot of storage space, data compression is especially important in computer graphics. Computer scientists have developed a variety of data compression techniques for graphics files. A useful survey of a variety of compression techniques that have been applied to graphics files can be found in Chapter 9 ("Data Compression") of Murray et al, *Graphics File Formats* (O'Reilly & Associates, 2d Ed. 1996) at pages 153–218.

Generally, two kinds of data compression exist: lossless compression in which no loss of data occurs during compression, and lossy compression, in which some data is lost and is not incorporated in the compressed data. In general, both types of data compression techniques rely on reducing the amount of data redundancy in the compressed image. Data compression is a type of data encoding that is used to reduce the size of the data file. The process of converting recurring characters or patterns into shorter symbols, known as codes, is called encoding. The process of translating codes back into the original characters or patterns is called decoding.

One simple but effective data compression technique commonly used in the past for compressing graphics files is called run length encoding. Run length encoding is supported by many commonly-used bitmap graphics file formats such as, for example, TIFF, BMP and PCX. Run length encoding works by reducing the physical size of a repeating string of symbols (e.g., characters). This repeating string, called a "run", is typically encoded into two bytes. The first byte, called the "run count," represents the number of symbols in the run. The second byte, called the "run value," is the value of the symbol in the run (in the range of 0 to 255 binary for ASCII characters). For example, a character run of 15 "A" characters ("AAAAAAAAAAAAAAA") would normally require 15 bytes to store. The same string after run length encoding would require only two bytes: "15A".

Although much data compression work has been done in the past, further improvements are possible. In particular, there is a need for a data compression and decompression technique that has the simplicity, efficiency and low overhead associated with run length encoding techniques, but which is especially suited for character-mapped image and attribute data and allows efficient image decompression in a limited resource system such as a handheld portable video game system.

The present invention provides a new and improved data compression technique that enhances typical run length encoding by examining the input image file and finding the recurrence of symbols as well as recurrence of patterns of symbols that could be represented by shorter symbols. This multi-level compression technique can be implemented quite efficiently using only a small amount of overhead data so that resulting compressed image data can be efficiently decompressed, at run time "on the fly", in a processing-and-memory constrained environment such as a compact portable video game system. Such loss-less data compression/decompression is especially useful in a limited resource environment such as a handheld portable video game system, since it allows graphics and/or attribute data to be efficiently and quickly decompressed on an as-needed basis in real time response to interactive user inputs.

In the preferred embodiment, a common "sentinel" field format encodes whether data following the field is non-redundant data, a symbol run, or a pattern run. Compression ratios of 60% for representative character-mapped video display graphics/attribute files can be achieved.

A data compression method in accordance with one aspect of the invention is characterized by scanning an input file to detect pattern and symbol redundancy; if the scanning step reveals a pattern redundancy, run length encoding said pattern redundancy and writing said run length encoded pattern redundancy to an output file; if the scanning step reveals symbol redundancy, run length encoding said symbol redundancy and writing said run length encoded symbol redundancy to said output file; and if the scanning step reveals neither symbol redundancy nor pattern redundancy, writing non-redundant information to said output file.

A data decompression method is characterized by reading, within an input file, a predetermined data format capable of indicating any of (a) pattern redundancy, and (b) symbol redundancy; if the predetermined data format indicates pattern redundancy, run length decoding a redundant pattern run associated with said predetermined data format; if the predetermined data format indicates symbol redundancy, run length decoding a redundant symbol run associated with said predetermined data format; and if the predetermined data format indicates neither pattern redundancy nor symbol redundancy, reading non-redundant data associated with said predetermined data format.

The predetermined data format may comprise a sentinel field format including a first field indicating redundancy or non-redundancy and a second field indicating the number of redundant symbols if symbol redundancy exists, the value of said first and second fields together being encoded with a predetermined value if the scanning step reveals pattern redundancy.

BRIEF DESCRIPTION OF THE DRAWINGS

These and other features and advantages provided by the present invention will be better and more completely understood by referring to the following detailed description of preferred embodiments in conjunction with the drawings of which:

FIG. 2A is a memory map of the display RAM of the FIG. 1 system;

FIG. 2B is a schematic illustration of the display area of the FIG. 1 system scrolling within a larger virtual background character map;

DETAILED DESCRIPTION OF PRESENTLY PREFERRED EXAMPLE EMBODIMENTS

General Description of an Example Prior Art Color Video Game Color System

Figure 1:
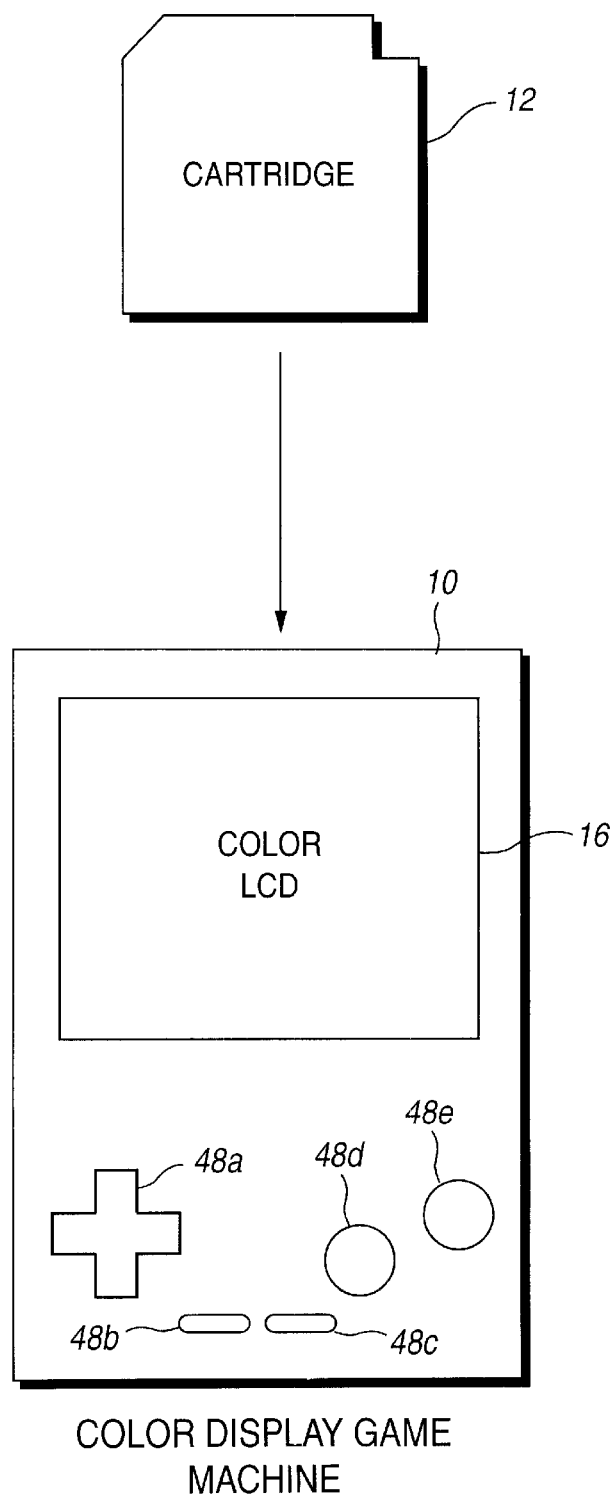
FIG. 1 shows an example prior art handheld portable video game system.

FIG. 1 shows a prior art portable color display game system 10 known as GAME BOY COLOR® sold by Nintendo that displays game characters on a color liquid crystal display (LCD) 16. System 10 accepts a cartridge-based memory device 12 that supplies a particular video game or other program to be executed by system 10. Different games or other applications can be played by inserting different cartridges 12.

System 10 includes a variety of operating keys 48a–48e for receiving interactive inputs from a user. The operating key 48a is used to instruct movement of a game character displayed in the color LCD 16 in four directions, that is, upward, downward, right and left. The operating key 48b is a select key that is used for, for example, game mode selection and the like. The operating key 48c is a so-called start key that is used to start playing the game or temporarily stop the progress of the game. The operating keys 48d, 48e are push-button switches. By operating the operating keys 48d, 48e, it is possible (depending on the particular game being played) to display various motions of the game characters displayed on the color LCD 16, for example, weapon use, a jump and the like. The operating keys 48a–48e are disposed in a forward surface of the color display game machine 10 as shown in FIG. 1, and system 10 responds to operation of these keys 48 in real time to produce corresponding character and background motion on display 16.

Figure 2:
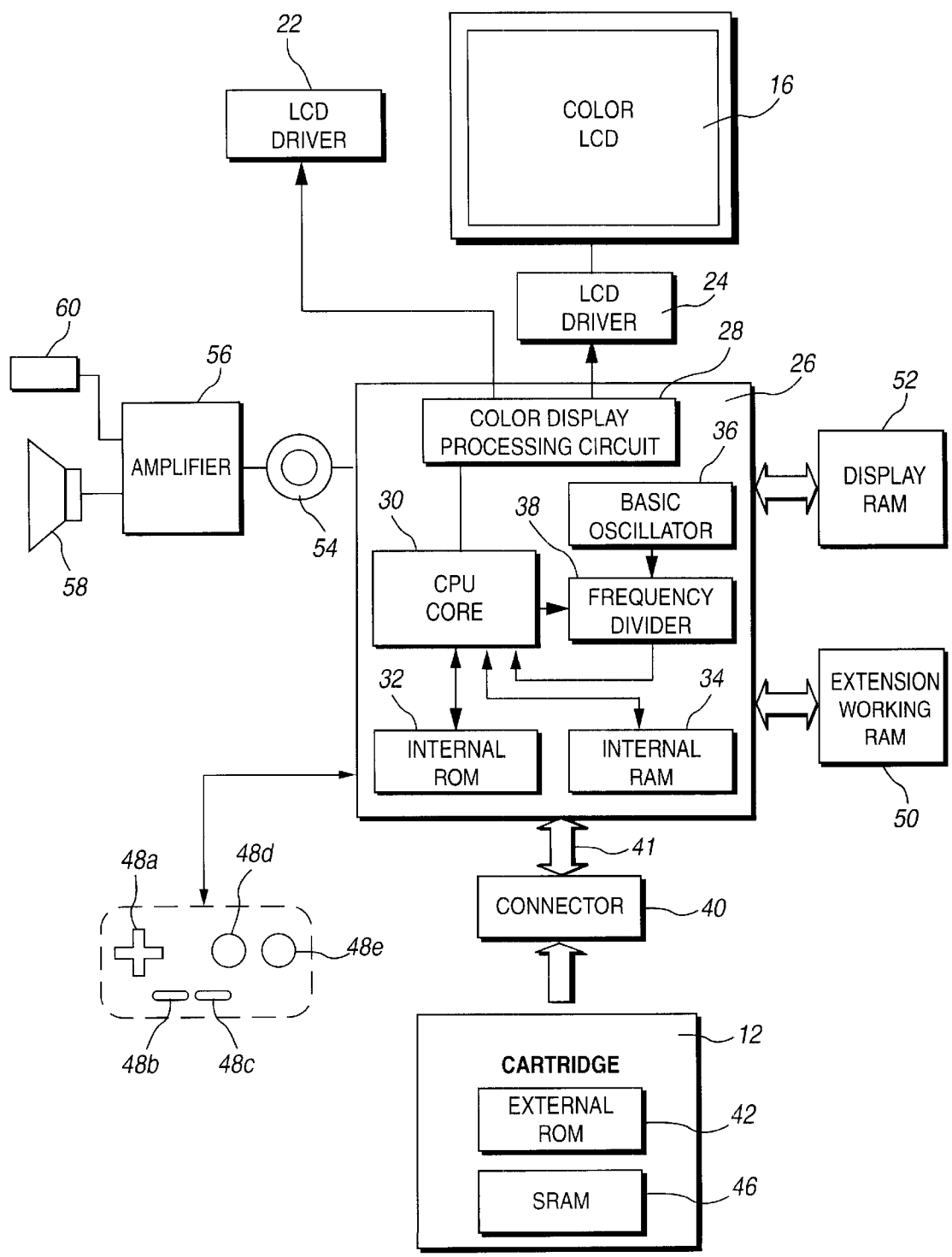
FIG. 2 is a block diagram of the FIG. 1 system.

FIG. 2, a prior art block diagram of system 10, shows the color display game system 10 including color LCD 16 provided as a dot matrix display. The color LCD 16 is driven by LCD drivers 22, 24 to display color images. The LCD driver 22 selectively drives, for example, the rows of the LCD 16 dot matrix, and the LCD drivers 24 selectively drives, for example, the columns of the LCD dot matrix. The LCD drivers 22, 24 are supplied with color image signals from a color display processing circuit 28 included in a CPU 26. The CPU 26 further includes a CPU core 30 connected to an internal ROM 32 and an internal RAM 34. The CPU 26 further includes a basic quartz crystal oscillator 36 and an associated frequency divider 38 that supplies an oscillating signal at a nominal speed of 2.10 MHz.

A connector 40 is connected to the CPU 26 by an appropriate bus 41. The cartridge 12 is selectively attached to the connector 40. Cartridge 12 includes an external ROM 42 and an SRAM 46. ROM 42 stores video game program instructions and data. The SRAM 46 of each cartridge is used to store backup data of the game. In accordance with the game program and character data supplied from the cartridge 12 and the controller data from the operating keys 48a–48e, the CPU 26 performs data processing operations and writes display data into a display RAM 52, using an extended RAM 50 when necessary. Display RAM 52 has, as a whole, a storage area that is greater than the display area of the color LCD 16, which enables scrolling display upward and downward and/or rightward and leftward in the screen of the color LCD 16.

Prior art FIG. 2B is an example memory map of display RAM 52. The display RAM 52 may be divided into two banks each of which includes two display memories. In this example, display RAM 52 performs a character mapping function, i.e., it stores character "stamps" or "tiles" that are mapped to display 16 in accordance with character codes also stored in display RAM 52. In this example, the tiles are each defined as a 64-dot area formed as 8×8 pixels of color LCD display 16. As shown in prior art FIG. 2B map of the display range of the LCD display, LCD display 16 is 160 pixels wide and 144 pixels high, and can therefore display 20×18=360 8-by-8 pixel background tiles simultaneously.

In this example, the tile data for the background characters is written into display RAM 52, and character code/attribute data information used to character-map this tile data onto the LCD 16 display space is also written into the display RAM 52. As shown in FIG. 2B, display memory 52 may have a storage capacity corresponding to a number (1024) of tiles that is considerably greater than the number (360) of tiles simultaneously displayable by the color LCD 16 to allow smooth scrolling of the 20×18 tile "window" comprising LCD display 16 anywhere within a 32×32 tile character map. Generally, the tile data and attribute data is initially stored in cartridge 12, and is transferred by CPU 26 into display memory 52 for display.

Without the benefit of compression techniques, cartridge 12 must supply graphics and attribute files each having a size of 1024 Kbytes (i.e., 1.024 Mbytes) for storage as a background character map in display RAM 52. For a complex game having many background screens, the amount of cartridge storage space required just to store the graphics data may be excessive. Data compression can be used to compress the data file and the attribute file, but any data compression technique used to reduce the size of the image and attribute files should allow very efficient decompression since the limited processing resources provided by CPU 26 are often occupied performing other tasks associated with interactive game play, and users will not wish to suffer delays in game play waiting for new image and attribute files to be decompressed.

Compression Technique in Accordance with a Presently Preferred Embodiment of this Invention The present invention provides a compression technique based on run length encoding that allows fast, efficient, low overhead decompression in the resource-constrained environment of system 10.

Figure 3:
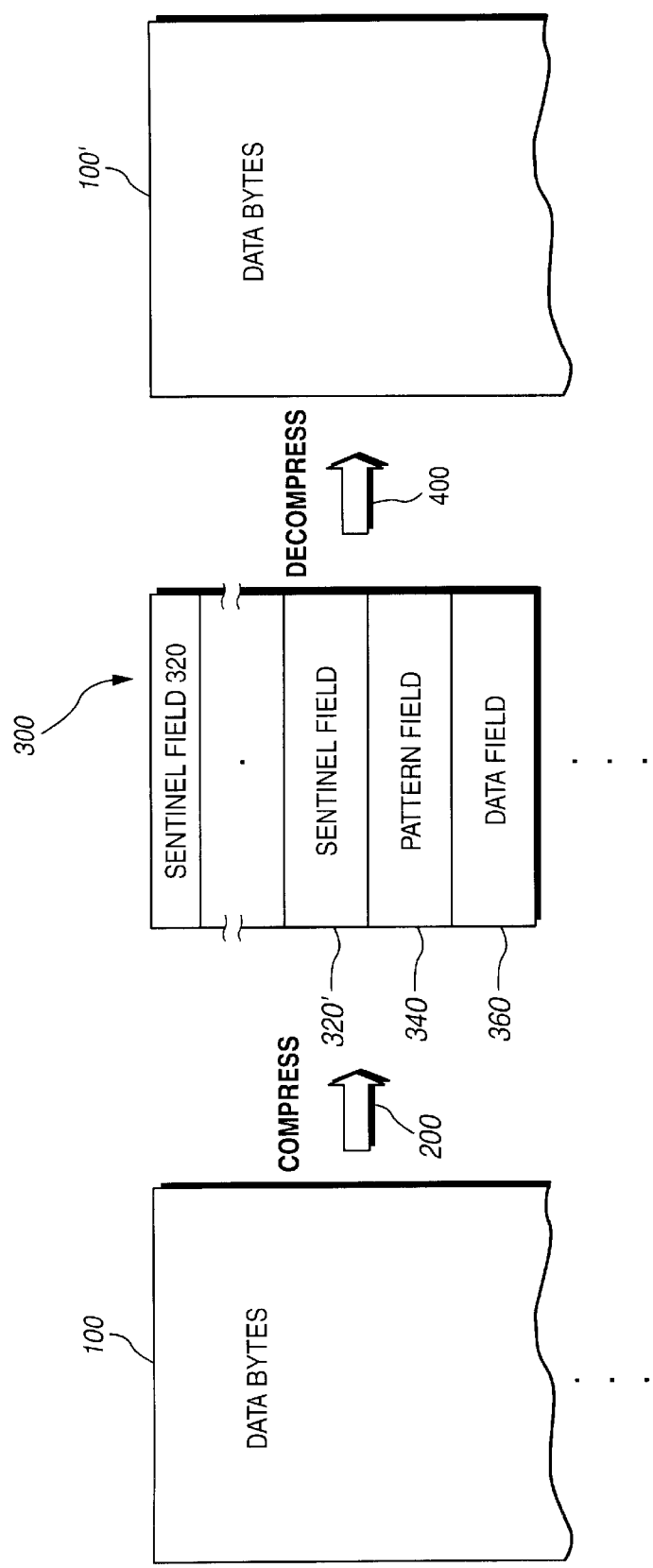
FIG. 3 shows an example overall compression/decompression process provided by a preferred embodiment of this invention.

FIG. 3 shows an example compression/decompression process in accordance with a presently preferred example embodiment of the present invention. An input file 100 comprising, for example, graphics image and/or attribute data is processed by a compression process 200. Compression process 200 encodes input file 100 to produce a compressed data structure 300. Compressed data structure 300 may, for example, be stored within the read only memory 42 of cartridge 12. During operation of system 10, processor 26 may read compressed data structure 300 from cartridge 12 and decompress the data structure using a decompression process 400. The resulting decompressed data file 100' is used by system 10 to generate images for display on display 16. In the preferred embodiment, compression process 200 is loss-less such that decompressed output file 100' is an exact copy of input file 100 prior to compression.

FIG. 3 shows that compressed data structure 300 may include one or more sentinel fields 320, one or more pattern fields 340, and one or more data fields 360. There will be a variable number of fields 320, 340, 360 in compressed data structure 300, depending on the contents of input file 100. In the preferred embodiment, sentinel fields 320 are used to run-length-encode redundant symbols (e.g., characters), and pattern fields 340 are used to run-length-encode redundant patterns of symbols (e.g., character patterns). Data fields 360 that do not have a high degree of redundancy are not encoded by the preferred embodiment, but rather, are passed by compression process 200 in unencoded form to avoid the negative compression ratios sometimes associated with run length encoding techniques (i.e., where the overhead introduced by "compression" actually increases (or at least does not decrease) the size of the "compressed" output file relative to the "uncompressed" input file). There may be more than one of each of fields 320, 340, 360 in compressed file 300.

Example Sentinel Field

Figure 4:
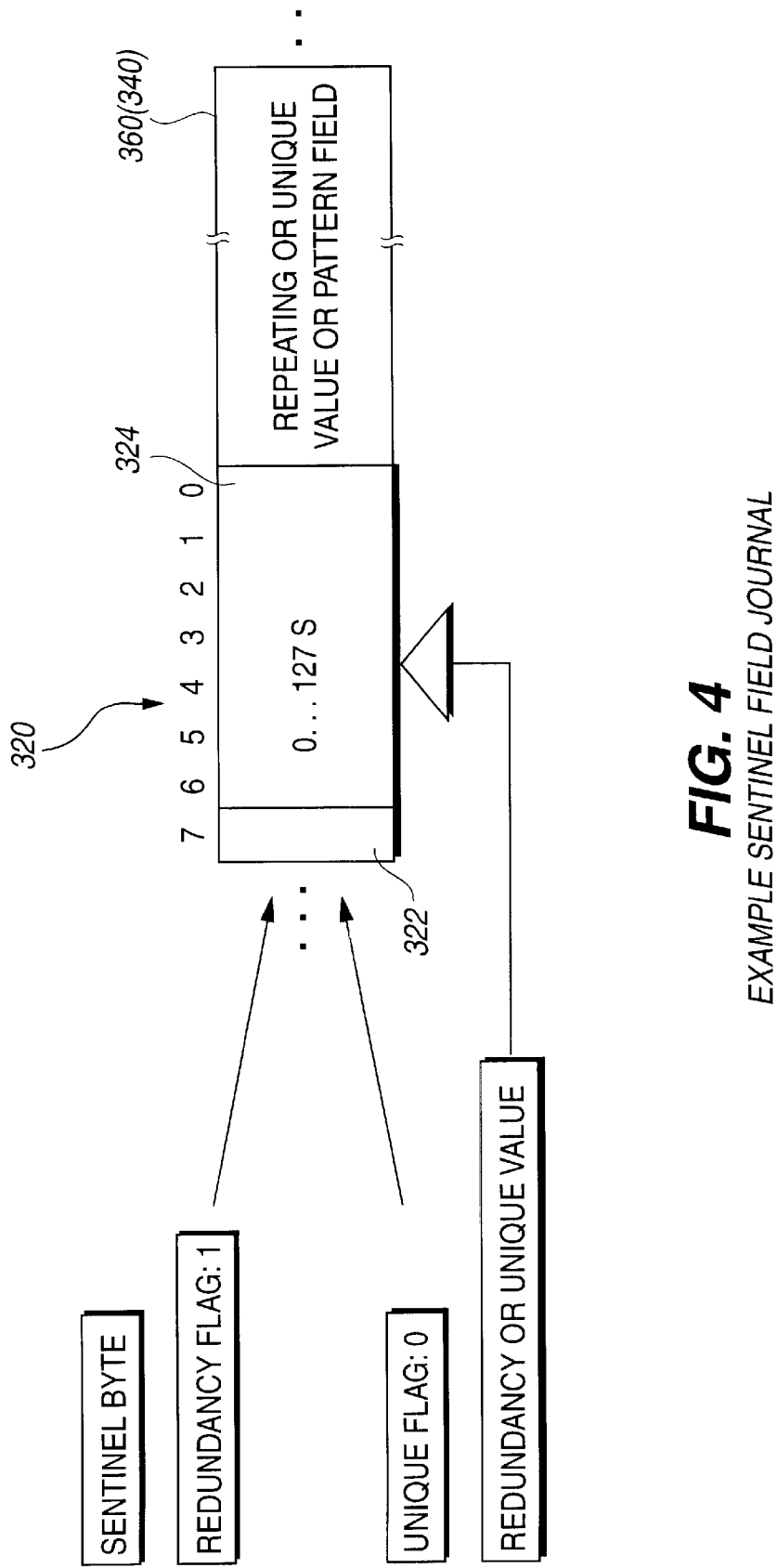
FIG. 4 shows an example sentinel field format.

FIG. 4 is a schematic illustration of an example sentinel field 320 provided by the preferred embodiment of this invention. The sentinel field 320 is one byte (8 bits) long in the preferred embodiment, and has two unequal parts: a flag 322, and number field ("S") 324. In the preferred embodiment, the sentinel field 320 is used to indicate whether the data following it is a redundant character run, a redundant symbol run, or neither.

In the preferred embodiment, flag 322 is used to determine whether data redundancy was detected. The size of flag 322 in the preferred embodiment is 1 bit. The preferred embodiment uses the most significant bit of sentinel field 320 as flag 322, and sets the flag to "1" to specify that a redundancy was detected and to "0" to specify the opposite.

In the preferred embodiment, the number field 324 occupies the rest of the sentinel field 320 (i.e., from bit 0 to 6 in the preferred embodiment). The value stored in number field 324 specifies the number of redundancy or unique (i.e., non-redundant) bytes encoded by the sentinel field 320. More specifically, if the flag 322 encodes a unique value (i.e., flag =0), then number field 324 indicates how many non-repeating symbols follow the sentinel field 320. If flag 322 encodes redundancy (i.e., flag =1), then number field 322 indicates how many times a symbol should be repeated. The maximum number of redundancy or unique bytes that can be represented in the preferred embodiment is 127.

A further field 360 or 340 follows sentinel field 320 in the preferred embodiment. The contents of this further field depends on the contents of sentinel field 320. If flag 322 indicates a non-redundant value (e.g., flag =0), then the following field comprises a data field 360 containing a string of non-redundant symbols of length indicated by number field 324. If flag 322 encodes a redundant value (flag =1), then the following field comprises a data field 360 one byte long that contains the symbol to be repeated.

The preferred embodiment also includes a special case: if number field 324 is set to 0 (indicating zero redundant or non-redundant symbols), this indicates that the information immediately following sentinel field 320 is not redundant or non-redundant data, but instead comprises a pattern field 340 used to encode a pattern run that follows the pattern field.

Preferred Embodiment Pattern Field 340

Figure 5:
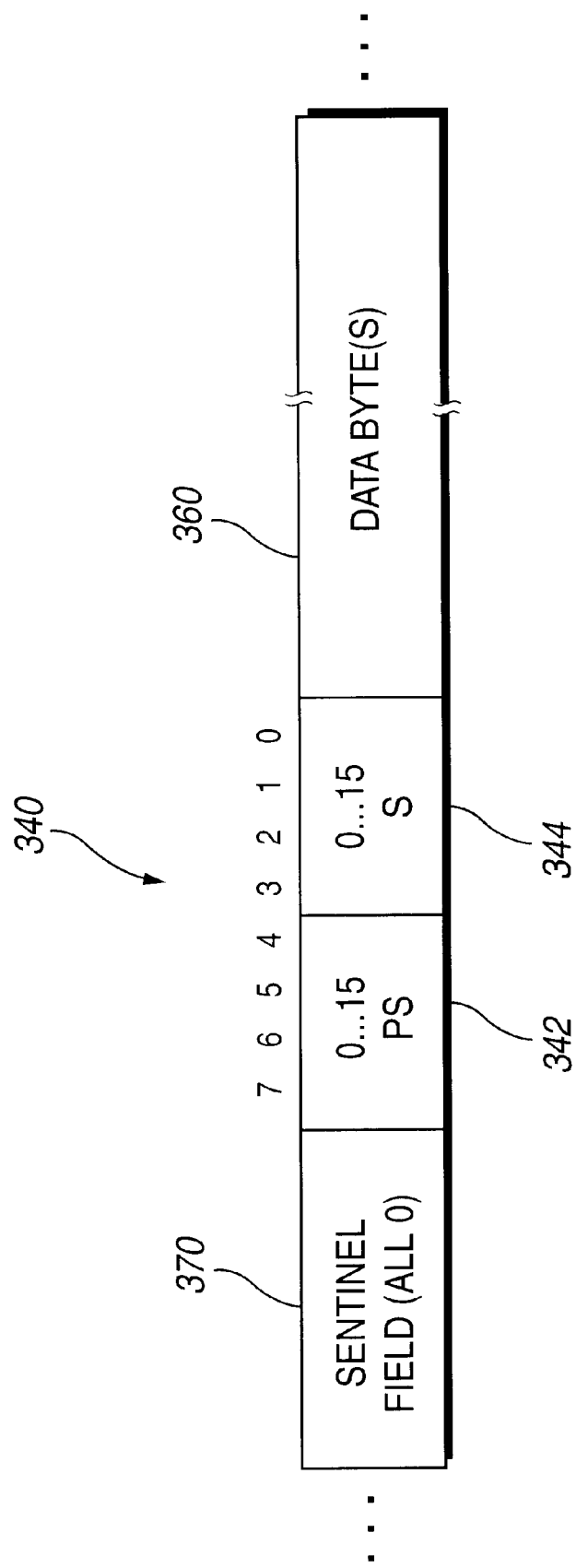
FIG. 5 shows an example pattern field format.

FIG. 5 shows an example pattern field 340 in accordance with a preferred embodiment of this invention. As indicated above, the preferred embodiment indicates that a pattern field 340 is present in the compressed data structure 300 by preceding it with a special, all-zero form of sentinel field 320. In the preferred embodiment, the size of pattern field 340 is one byte long. In the preferred embodiment, pattern field 340 consists of two equal parts 342, 344 of four bits each. The first part "PS" 342 (which may be the high nibble, i.e., bits 7 through 4 ) encodes the length of the redundant pattern in bytes. Since the preferred embodiment uses four bytes to encode this information, the maximum pattern size in bytes will be 15. The second part "S" 342 (the low nibble, i.e. bits 3 through 0 in the preferred embodiment) encodes the redundancy value of the pattern—that is, how many times the pattern is repeated. Since the preferred embodiment uses four bits to store the redundancy value, the maximum value that can be represented is 15. In the preferred embodiment, the pattern field 340 is followed by a data field 360 containing the redundant pattern symbol string having a length, in bytes, corresponding to the value "PS" contained by field 342. This data field 360 stores the pattern that is repeated the number of times indicated by "S" field 344.

Example Data Compression Process 200

Figure 6:
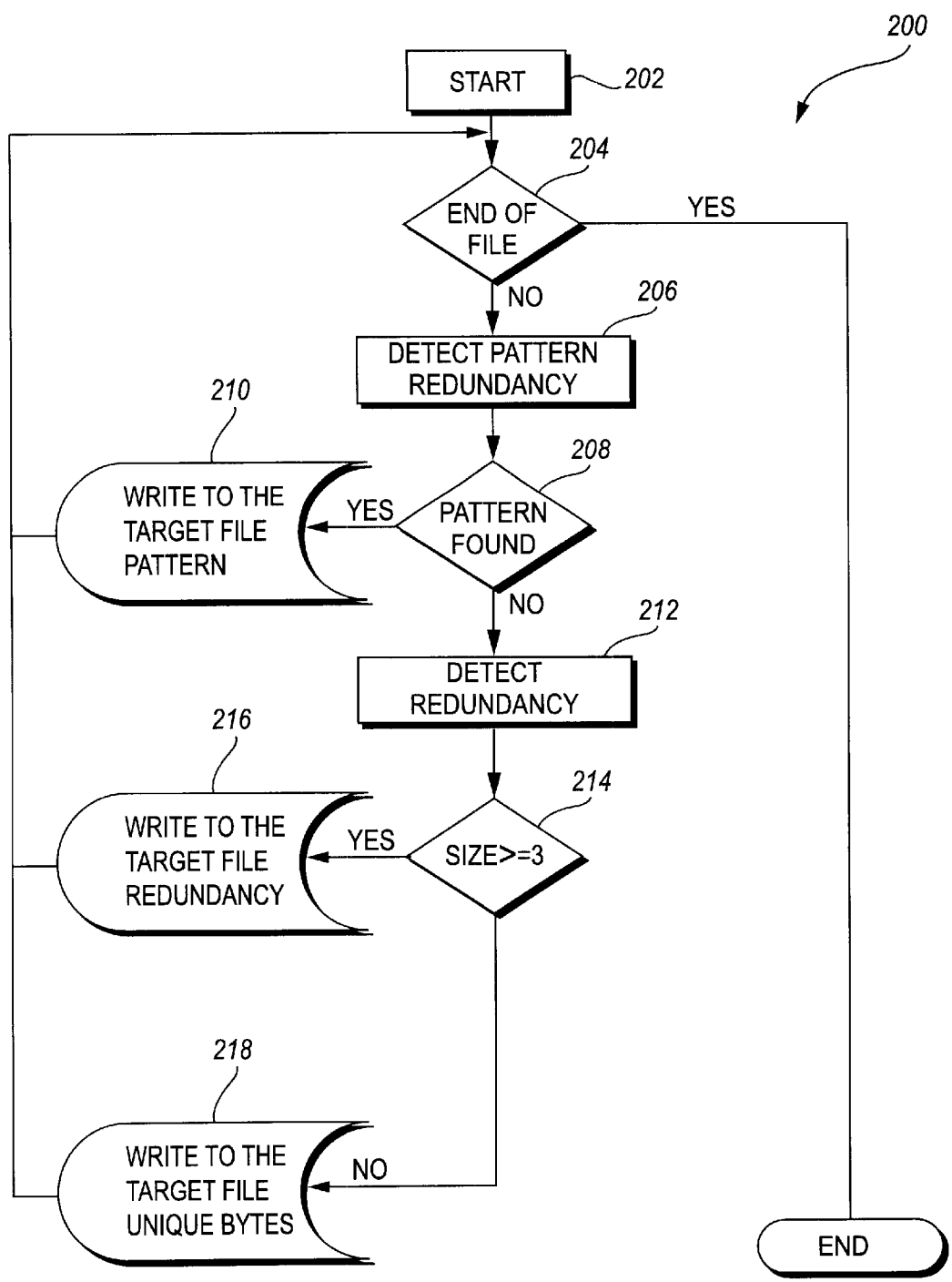
FIG. 6 is a flowchart of an example compression process.

FIG. 6 is a flowchart of example steps of a compression process 200 provided by the preferred embodiment of this invention. Process 200 uses two passes to compress an input file 100. The first pass (blocks 206–210) is used to detect and encode redundant patterns. The second pass (blocks 212–218) is used to identify and separate the redundant from the non redundant data, i.e., to identify and encode redundant symbols.

The preferred embodiment second pass includes a test 214 that tests whether a symbol is found consecutively at least 3 times. Test 214 declares a symbol to be redundant only if it is found consecutively at least 3 times. Test 214 thus prevents process 200 from introducing the overhead associated with run-length-encoding if a symbol is repeated only once. Since compressing a symbol repeated only once in the preferred embodiment will not result in any data reduction but will introduce additional encoding complexity, the preferred embodiment compression process 200 treats the data as non-redundant and passes such data "as is" without any encoding.

In the preferred embodiment, every first pass scan consists of 225 bytes maximum since the largest value for redundancy value in the pattern field 342 is 15 with a size of 15 bytes. The value 225 could grow to 65025 bytes if we use two bytes to encode pattern field 340. In this alternative arrangement, a one-byte field 342 could be used to store the size of the pattern, and a one-byte field 344 would be used to store the number of times the pattern is repeated (i.e., a redundancy value). Since the preferred embodiment uses a 7-bit sentinel field number value 324 to specify the number of redundancy or unique bytes, only the next 128 bytes will be scanned on the second pass.

The following is a more detailed description of the preferred embodiment process shown in the FIG. 6 flowchart, which is looped until the end of the input file 100 (as tested for by decision block 204):

1. Scan the next 225 bytes and detect pattern redundancy (blocks 206, 208). Since the pattern field 340 can hold a maximum of 15 redundancy of size 15 bytes, there is no need to scan more then 225 bytes in the preferred embodiment.
2. If pattern redundancy is found ( "yes" exit to decision block 208), write an appropriate sentinel field 320, pattern field 240 and data field 260 encoding the redundant pattern to the target file 300 (block 210) and go to step 1 (block 204).
3. Scan the next 127 bytes and detect symbol redundancy of length 3 or more (blocks 212, 214). Since the sentinel field 320 can hold a maximum value of 127, there is no need to scan more then 127 bytes at once. Block 214 will reject redundancy of length two because it takes two bytes to store them—which is the same size as the original data.
4. If redundancy found ( "yes" exit to decision block 214), write an appropriate sentinel field 320 and data field 360 encoding the redundant symbol to the target file (block 216) and go to step 1 (block 204).
5. If no redundancy found ( "no" exit to decision block 214), write an appropriate sentinel field 320 and data field 360 that passes the non-redundant symbols without encoding to the target file (block 218) and go to step 1 (block 204).

Compression Example

The following is an illustrative example of data compression performed by the preferred embodiment process shown in FIG. 6 and described above.

Original File 200 of size 61 bytes:

0xDE 0xAE 0x2E 0x0C 0x55 0x21 0xDE 0xDE 0xDE 0xDE 0xDE
0xDE 0xDE 0xDE 0xDE 0xDE 0xDE 0xDE 0xDE 0xDE 0xDE 0xDE
0xDE 0xDE 0xDE 0xDE 0xDE 0xDE 0xDE 0xDE 0xDE 0xDE 0xDE
0xDE 0xDE 0xDE 0xDE 0xDA 0xDE 0xDA 0xDE 0xDA 0xDE 0xDA
0xDE 0xDA 0xDE 0xDA 0xDE 0xDE 0xA8 0x2E 0x0f 0x54 0x21
0xDD 0xAA 0x22 0xFC 0x66 0x26

Original file retyped in order to emphasize on the detection types

Unique bytes

0xDE    0xAE    0x2E    0x0C    0x55    0x21

Redundancy

0xDE 0xDE 0xDE 0xDE 0xDE 0xDE 0xDE 0xDE 0xDE 0xDE
0xDE 0xDE 0xDE 0xDE 0xDE 0xDE 0xDE 0xDE 0xDE 0xDE
0xDE 0xDE 0xDE 0xDE 0xDE 0xDE 0xDE 0xDE 0xDE 0xDE
0xDE

Pattern

0xDA 0xDE 0xDA 0xDE 0xDA 0xDE 0xDA 0xDE 0xDA 0xDE 0xDA
0xDE

Unique bytes

0xDE 0xA8 0x2E 0x0f 0x54 0x21 0xDD 0xAA 0x22 0xFC 0x66 0x26

Compressed file 300 of size 26 bytes (for clarity, the sentinel field 320 is shown in binary format, the pattern field 340 is shown in hexadecimal format between quotes, and data fields 360 are shown in hexadecimal format):

Unique 00000110    0xDE 0xAE 0x2E 0x0C 0x55 0x21

Redundancy 10011111    0xDE

Pattern

00000000    '0x26' 0xDA 0xDE

Unique 00001100    0xDE 0xA8 0x2E 0x0f 0x54 0x21 0xDD 0xAA 0x22
            0xFC 0x66 0x26

Example Preferred Embodiment Decompression Process 400

Figure 7:
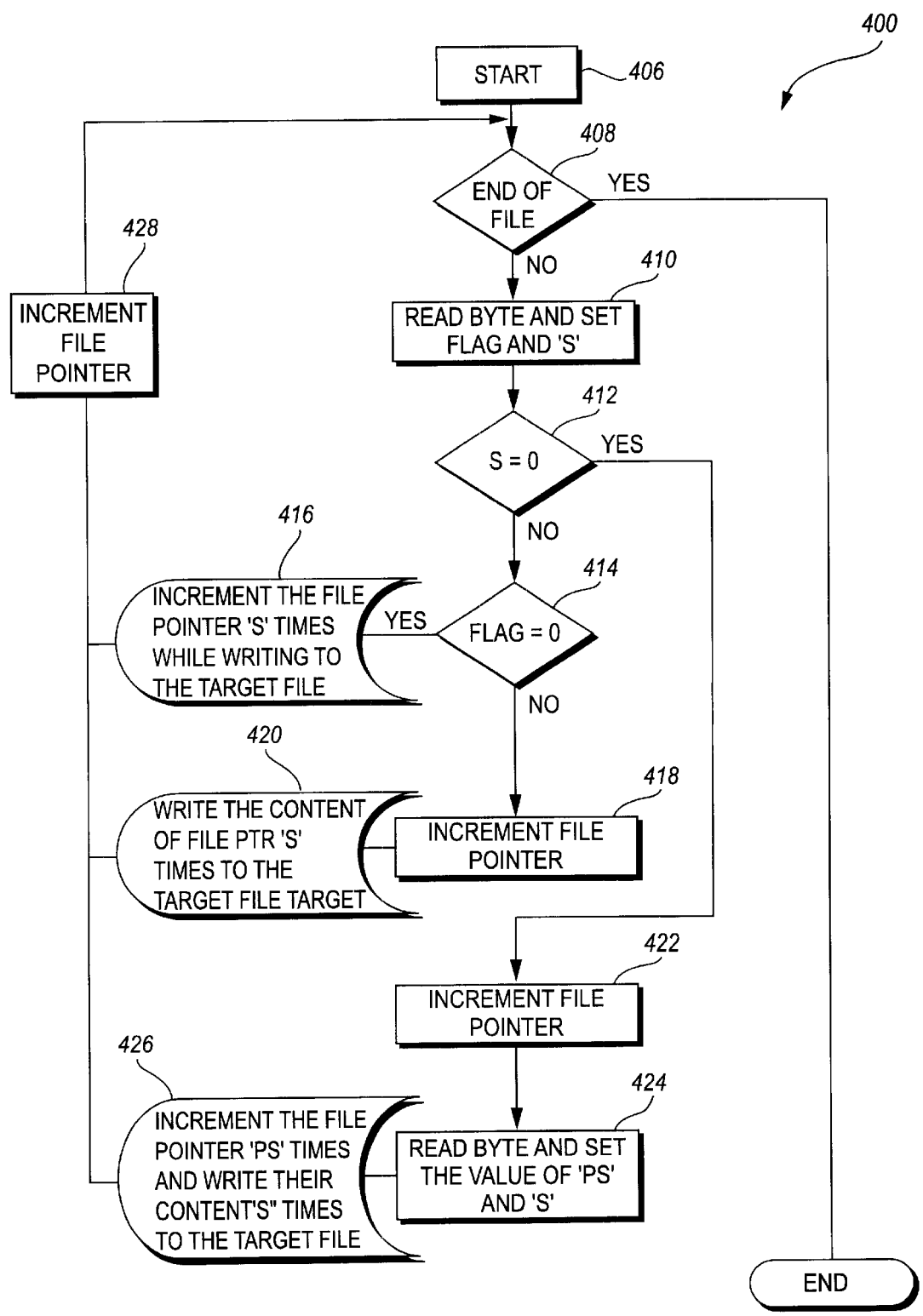
FIG. 7 is a flowchart of an example decompression process.

FIG. 7 is a flowchart of an example decompression process 400 provided by the preferred embodiment of this invention. Preferred embodiment decompressing process 400 relies on the sentinel fields 320 to indicate whether the information following such fields is encoded and how it is encoded. Using the first sentinel field 320, which is located at the beginning of the compressed file 300, the process 400 will write the appropriate data to the target (uncompressed) file 100' and move to the next sentinel field.

Figure 8:
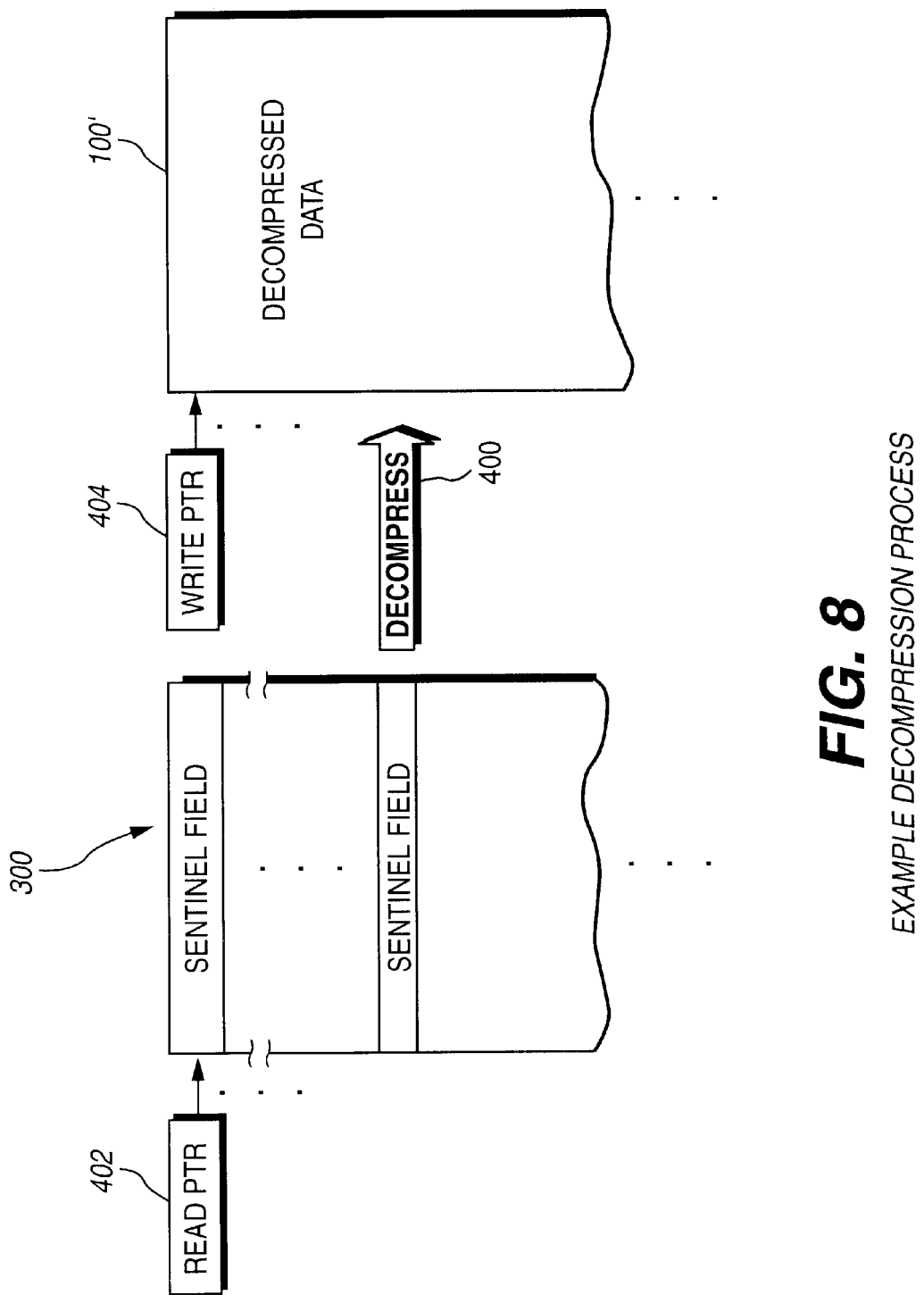
FIG. 8 schematically illustrates example read and write pointer manipulation during the FIG. 7 decompression process.

The sentinel field 320 determines by how much a read file pointer 402 should move while reading the compressed file 300, and at the same time positions the read file pointer 402 to the next sentinel field (see FIG. 8). If the most significant bit of the sentinel field 320 is set to 1 and the value "S" of the following number field 324 (i.e., next 7 bits from bit 0 to bit 6) is greater than zero, the read file pointer 402 will move to the next byte which will be written 'S' times to the target file 100'. If the most significant bit of the sentinel field 320 is set to 0 and the value 'S' of the next 7 bits from bit 0 to bit 6 of number field 324 is greater then zero, the read file pointer 402 will move to the next 'S' byte while writing their contents to the target file 100' (in other words, the read file pointer 402 will copy the next S bytes to the target file). If the value of the first 7 bits of the sentinel field 320 (i.e., bit 0 to bit 6) is equal to zero, the next byte will be a pattern field 340 encoding a pattern run. The pattern field 340 holds the pattern size 'PS' found in upper 4 bits (field 342), and the pattern redundancy value 'S' which is a number of 4 bits where they are found in the lower 4 bits (field 344) of the pattern field 340. In this case, the next 'PS' bytes will be written 'S' times to the target file 100'.

The following is a more detailed description of the FIG. 7 process (which is looped until the end of compressed file 300 is reached, as tested for by decision block 408):

1. Read the content of the sentinel field flag 322 (bit 7 of sentinel field 320) into 'Flag' and the rest of the sentinel field (bits 0 to 6, i.e., number field 324) into 'S' (block 410)
2. If value of 'S' is equal to 0 ( "yes" exit to decision block 412) indicating a pattern run, go to step 8 (block 422)
3. If value of flag is 0 ( "yes" exit to decision block 414) indicating a non-redundant symbol string, go to step 6 (block 416).
4. To decode a redundant symbol run, increment the read file pointer 442 by one byte (block 418) and write the contents of the data block following the sentinel field 'S' times to the target file 100'(block 420)
5. Increment the file pointer to point to the next sentinel field in file 300 (block 428) and go to step 1 (block 408)
6. To read a non-redundant symbol string, increment the file pointer 'S' times while writing the corresponding data block to the target file (block 416)
7. Increment the file pointer (block 428) to point to the next sentinel field in file 300 and go to step 1 (block 408)
8. To decode a pattern run, increment the file pointer (block 422), and set the value of the upper 4 bits to 'PS', and the value of the lower 4 bits to 'S' (block 424).
9. Increment the file pointer 'PS' times and write the following data block content 'S' times to the target file (block 426), then go to step 1 (block 408).

Decompression Example

The following is an example of how the preferred embodiment decompression process shown in FIG. 7 can be used to decompress a compressed file 300 into a decompressed data file 100'.

Compressed file of size 26 bytes (for clarity purposes, the sentinel field 320 is shown in binary format, and the pattern field 340 in hexadecimal format between quotes, and data fields 360 in hexadecimal format).

Unique 00000110 0xDE 0xAE 0x2E 0x0C 0x55 0x21 (compressed)

Since the flag 322 of the first sentinel field 320 is zero, it translates to a unique (non-redundant), sequence of length 6 and the translation will be:

0xDE 0xAE 0x2E 0x0C 0x55 0x21 (decompressed)

Redundancy 10011111 0xDE (compressed)

Since the flag 322 of the sentinel field 320 is 1, it translates to a redundancy of length 31 and the translation will be:

0xDE 0xDE 0xDE 0xDE 0xDE 0xDE 0xDE 0xDE 0xDE 0xDE 0xDE
0xDE 0xDE 0xDE 0xDE 0xDE 0xDE 0xDE 0xDE 0xDE 0xDE 0xDE
0xDE 0xDE 0xDE 0xDE 0xDE 0xDE 0xDE 0xDE 0xDE (decompressed)
Pattern 00000000  '0x26'  0xDA  0xDE  (compressed)

Since the value of sentinel number field 324 is equal to 0, the next field is a pattern field 340—in this case, the pattern field specifies that we have a pattern redundancy of length 2 bytes repeated 6 times, and the translation will be:

0xDA 0xDE 0xDA 0xDE 0xDA 0xDE 0xDA 0xDE 0xDA 0xDE 0xDA
0xDE                                                    (decompressed)
Unique
00001100    0xDE 0xA8 0x2E 0x0f 0x54 0x21 0xDD 0xAA 0x22
            0xFC 0x66 0x26                              (compressed)

Since the flag 322 of sentinel field 320 is zero, it translates to a unique (non-redundant) sequence of length 12 and the translation will be:

0xDE 0xA8 0x2E 0x0f 0x54 0x21 0xDD 0xAA 0x22 0xFC 0x66 0x26 (decompressed)

Combining all the decompressed sequences, we recover the original file 100 without losing any data:

Original File of size 61 bytes

0xDE 0xAE 0x2E 0x0C 0x55 0x21 0xDE 0xDE 0xDE 0xDE 0Xde
0xDE 0xDE 0xDE 0xDE 0xDE 0xDE 0xDE 0xDE 0xDE 0xDE 0xDE
0xDE 0xDE 0xDE 0xDE 0xDE 0xDE 0xDE 0xDE 0xDE 0xDE 0xDE
0xDE 0xDE 0xDE 0xDE 0xDA 0xDE 0xDA 0xDE 0xDA 0xDE 0xDA
0xDE 0xDA 0xDE 0xDA 0xDE 0xDE 0xA8 0x2E 0x0f 0x54 0x21
0xDD 0xAA 0x22 0xFC 0x66 0x26

Example Compression Ratio Results

The compression ratio one may expect to achieve using the preferred embodiment of the present invention will depend on the particular characteristics of the input data file 100 being compressed. Based on a test of 1650 sample GAME BOY COLOR® graphics/attribute files of size 2048 bytes each, the average compression ratio we achieved was approximately 60%.

In a worst case scenario, application of the compression technique of the present invention may actually increase the size of compressed file 300 relative to uncompressed file 100. In such instance, it would be desirable to pass the uncompressed file 100 "as is" to the target process without applying any encoding at all.

Example Video Game Using FIG. 7 Decompression Process

Figure 9:
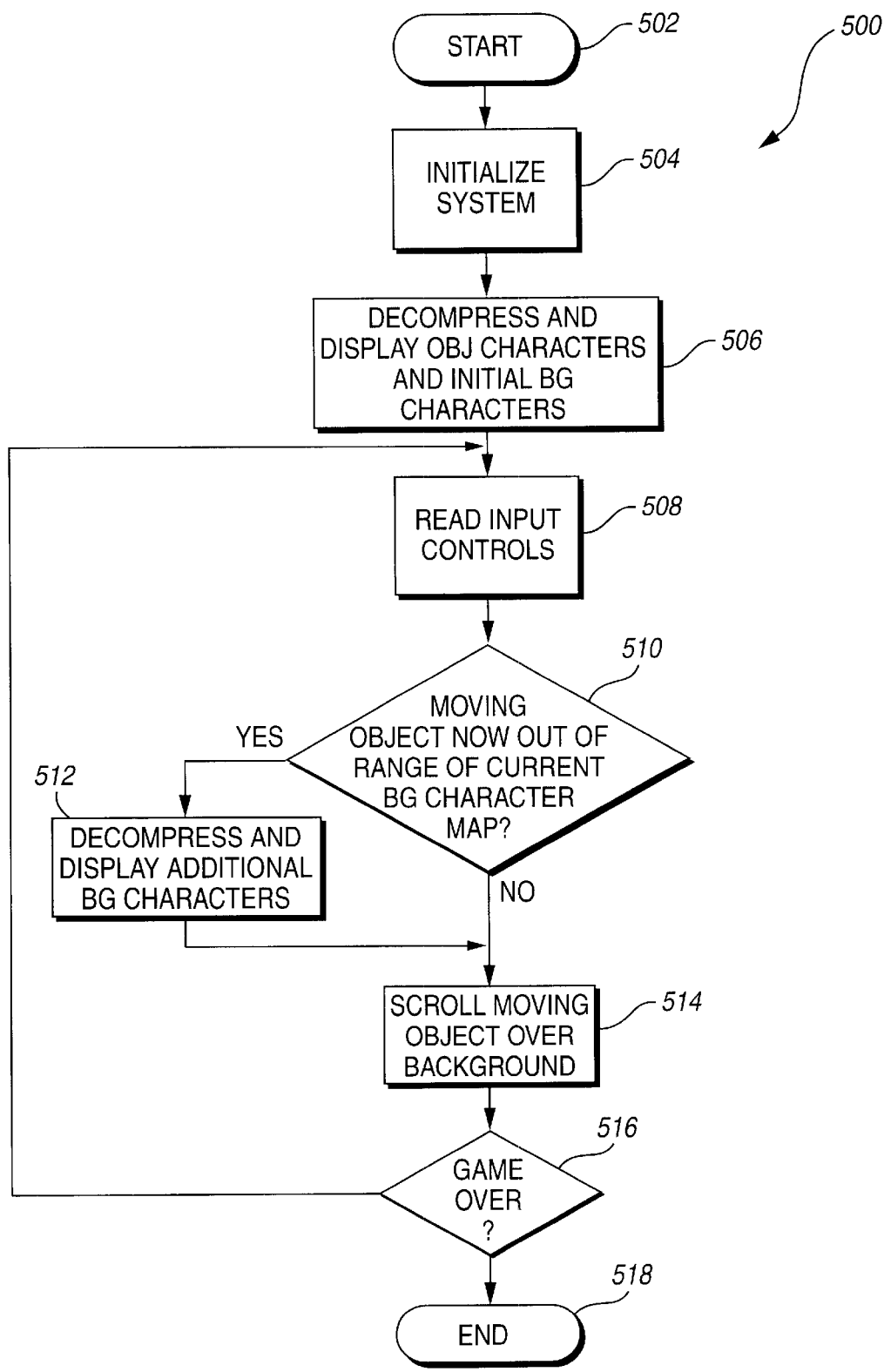
FIG. 9 shows an example simple video game program using the FIG. 7 decompression process.

Decompression process 400 may be performed by system 10's processor 26 in real time during interactive video game play under control of software stored in cartridge ROM 42. Decompression process 400 may, for example, be embodied in a software program stored in cartridge 12 as part of video game software. FIG. 9 is a flowchart of an example simple video game 500 that uses the FIG. 7 decompression process to decompress graphics and attribute files on an as-needed basis in an overall process that dynamically copies the files out of cartridge ROM 42, buffers them in RAM 34 and/or 50, and writes them into display RAM 52 for display during interactive game play (e.g., as a moving object character moves about in a level or landscape).

Referring to FIG. 9, video game program 500 in conjunction with software stored in boot ROM 32 may initialize system 10, conduct a security check, etc. (block 504). Video game program 500 may then read compressed data files 300 encoding background and moving object character graphics and attributes stored in cartridge ROM 42, decompress these files using the procedure described above in connection with FIG. 7, and store the resulting decompressed files 100' into display RAM 52 for display by system 10 (block 506). Video game program 500 may periodically read input controls 48 and interactively respond to user inputs by causing moving objects to jump, fight or the like and/or move the moving objects relative to background objects by scrolling the window of display 16 relative to the background object character map stored by display RAM 52 (see FIG. 2B) (block 514). In the event that the moving object must be moved out of range relative to the background object character map currently stored by display RAM 52 ("yes" exit to decision block 510), video game program 500 may decompress additional background character image and attribute files 300 stored by cartridge 12 in compressed form (once again, using the FIG. 7 decompression procedure) and write the resulting decompressed image and attribute files 100' into display RAM 52 for display by system 10 (block 512). The FIG. 7 decompression process 400 is sufficiently efficient and fast that such decompression can be performed in real time on an as-needed basis without introducing significant delays that will be bothersome to the user of system 10. The process of blocks 508–514 may continue until the game is over (block 516, 518).

While the invention has been described in connection with what is presently considered to be the most practical and preferred embodiment, it is to be understood that the invention is not to be limited to the disclosed embodiment, but on the contrary, is intended to cover various modifications and equivalent arrangements included within the scope of the appended claims. For example, while the data compression and decompression techniques disclosed herein are especially useful for character-mapped video game graphics and/or attribute data, these techniques could be used to compress/decompress any type of data including text, sound, image, code or other data.

We claim:

1. An interactive video game play process comprising:

displaying at least one moving object within a background character map;

reading interactive user inputs and responsively moving said moving object relative to said background character map;

testing whether said interactive user inputs command said moving object to move out of range of said background character map; and if said testing step reveals said interactive user inputs command said moving object to move out of range of said background character map, decompressing compressed further background character information and adding said decompressed further background character information to said background character map, wherein said decompressing includes reading a predetermined field format within said compressed further background character information, testing said field format to determine whether said field format indicates that information following said field comprises at least one non-redundant symbol, at least one redundant symbol or at least one redundant pattern, and decoding said information following said field format in response to said field format.

2. An interactive video game system comprising:

a liquid crystal display capable of displaying at least one moving object within a background character map;

a processor coupled to said liquid crystal display;

a display memory coupled to said processor, said display memory storing said background character map;

at least one user input device coupled to said processor; and a portable storage medium that can be interchangeably coupled to said processor, said portable storage medium storing compressed further background character information, said portable storage medium further storing at least one program that controls the processor to read interactive user inputs and responsively move said moving object relative to said background character map to test whether said interactive user inputs command said moving object to move out of range of said background character map; and if said testing step reveals said interactive user inputs command said moving object to move out of range of said background character map, to decompress said compressed further background character information during real time video game play and write said decompressed further background character information to said background character map within said display memory, wherein said program controls said processor to decompress by reading a predetermined field format within said compressed further background character information, test said field format to determine whether said field format indicates that information following said field comprises at least one non-redundant symbol, at least one redundant symbol or at least one redundant pattern, and to decode said information following said field based at least in part on said field format.

3. For use with an interactive video game system comprising a liquid crystal display capable of displaying at least one moving object within a background character map, a processor coupled to said liquid crystal display, a display memory coupled to said processor, said display memory storing said background character map, and at least one user input device coupled to said processor, a portable storage medium that can be interchangeably coupled to said processor, said portable storage medium storing:

(a) compressed f uirther background character information, and (b) at least one software program that, in use, controls the processor to:

(b1) read interactive user inputs from said user input device and responsively move said moving object relative to said background character map;

(b2) test whether said interactive user inputs command said moving object to move out of range of said background character map; and (b3) if said testing step reveals said interactive user inputs command said moving object to move out of range of said background character map, decompress said compressed further background character information during real time video game play and write said decompressed further background character information to said background character map within said display memory, wherein said program controls said processor to decompress by reading a predetermined field format within said compressed further background character information, test said field format to determine whether said field format indicates that information following said field comprises at least one non-redundant symbol, at least one redundant symbol or at least one redundant pattern, and to decode said information following said field based at least in part on said field format.

\* \* \* \* \*